(12) United States Patent
Feil et al.

(10) Patent No.: US 10,529,811 B2
(45) Date of Patent: Jan. 7, 2020

(54) POWER SEMICONDUCTOR DEVICE HAVING A TRENCH WITH CONTROL AND FIELD ELECTRODE STRUCTURES

(71) Applicant: Infineon Technologies Austria AG, Villach (AT)

(72) Inventors: Thomas Feil, Villach (AT); Michael Hutzler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/252,189

(22) Filed: Jan. 18, 2019

(65) Prior Publication Data

US 2019/0172916 A1  Jun. 6, 2019

Related U.S. Application Data

(62) Division of application No. 15/490,267, filed on Apr. 18, 2017, now Pat. No. 10,236,351.

(30) Foreign Application Priority Data

Apr. 19, 2016 (DE) .................. 10 2016 107 203

(51) Int. Cl.
*H01L 29/76* (2006.01)
*H01L 31/062* (2012.01)
(Continued)

(52) U.S. Cl.
CPC .......... *H01L 29/407* (2013.01); *H01L 29/401* (2013.01); *H01L 29/42356* (2013.01);
(Continued)

(58) Field of Classification Search
CPC ............ H01L 29/66666; H01L 29/407; H01L 29/401; H01L 29/42356
(Continued)

(56) References Cited

U.S. PATENT DOCUMENTS 7,868,363 B2     1/2011  Zundel et al.
8,129,780 B2 *   3/2012  Shinbori ............... H01L 29/407
                                                          257/334
(Continued)

FOREIGN PATENT DOCUMENTS

DE    102009035688 A1    4/2010
JP       2008177250 A    7/2008
KR      20070044481 A    4/2007

*Primary Examiner* — David S Blum
(74) *Attorney, Agent, or Firm* — Murphy, Bilak & Homiller, PLLC

(57) ABSTRACT

According to an embodiment of a power semiconductor device, the device includes a semiconductor body coupled to a first load terminal and a second load terminal and configured to conduct a load current between the first load terminal and the second load terminal. A trench extends into the semiconductor body along an extension direction and includes an insulator. A first electrode structure included in the trench is configured to control the load current. A second electrode structure included in the trench is arranged separately and electrically insulated from the first electrode structure. The first electrode structure and the second electrode structure are spatially displaced from each other along the extension direction such that they do not have a common extension range along the extension direction. Each of the first electrode structure and the second electrode structure is made of a metal.

20 Claims, 6 Drawing Sheets

(51) Int. Cl.
*H01L 31/113* (2006.01)
*H01L 31/119* (2006.01)
*H01L 29/40* (2006.01)
*H01L 29/423* (2006.01)
*H01L 29/78* (2006.01)
*H01L 29/66* (2006.01)

(52) U.S. Cl.
CPC .. *H01L 29/42376* (2013.01); *H01L 29/66666* (2013.01); *H01L 29/7813* (2013.01); *H01L 29/7827* (2013.01)

(58) Field of Classification Search
USPC ........................................................ 257/329
See application file for complete search history.

(56) References Cited

U.S. PATENT DOCUMENTS

| | | |
|---|---|---|
| 2004/0063269 A1 | 4/2004 | Kocon |
| 2010/0025758 A1 | 2/2010 | Cho |
| 2014/0061781 A1 | 3/2014 | Kim |

* cited by examiner

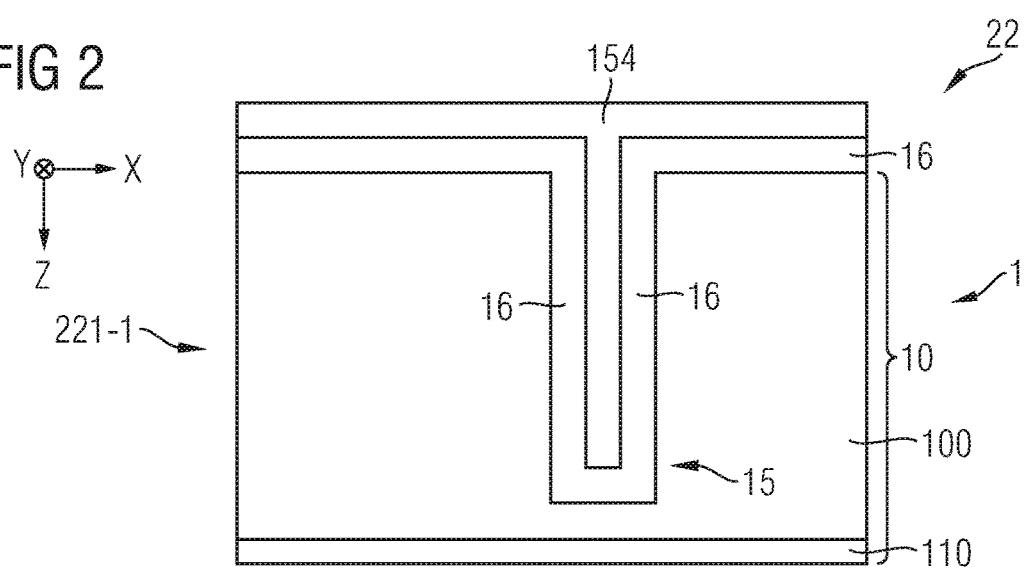
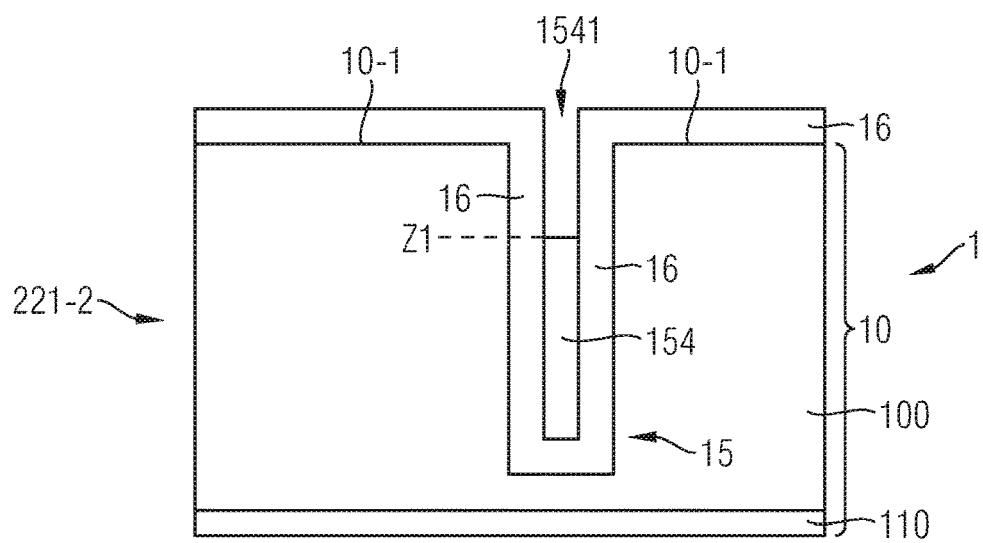
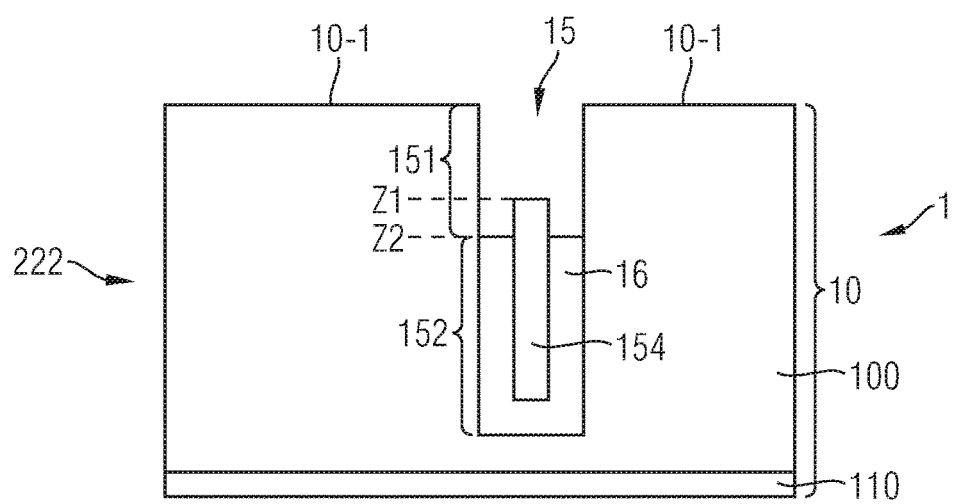

POWER SEMICONDUCTOR DEVICE HAVING A TRENCH WITH CONTROL AND FIELD ELECTRODE STRUCTURES

TECHNICAL FIELD

This specification refers to embodiments of a method of processing a power semiconductor device and to embodiments of a power semiconductor device. In particular, the specification is directed to embodiments of a power semiconductor device having a trench that includes each of gate electrode structure and a field electrode structure, and to embodiments of a method of processing such power semiconductor device.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

In some cases, the gate electrode may be included within a trench of the power semiconductor device, wherein the trench may exhibit, e.g., a stripe configuration or a needle configuration.

Further, such trench occasionally includes more than only one electrode, e.g., two or more electrodes that are arranged separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

SUMMARY

According to an embodiment, a method of processing a power semiconductor device comprises providing a semiconductor body that includes a trench, the trench extending into the semiconductor body along an extension direction and comprising an insulator; providing a monolithic electrode zone within the trench; removing a section of the monolithic electrode zone within the trench to divide the monolithic electrode zone into at least a first electrode structure and a second electrode structure arranged separately and electrically insulated from each other.

According to a further embodiment, a power semiconductor device comprises a semiconductor body coupled to a first load terminal and a second load terminal and configured to conduct a load current between said terminals, the power semiconductor device including: a trench extending into the semiconductor body along an extension direction and comprising an insulator; a first electrode structure included in the trench and configured to control the load current; a second electrode structure included in the trench and being arranged separately and electrically insulated from the first electrode structure; wherein the first electrode structure and the second electrode structure are spatially displaced from each other along the extension direction such that they do not exhibit a common extension range along the extension direction; and wherein the first electrode structure and the second electrode structure are further spatially displaced from each other along a first lateral direction such that they do not overlap along the first lateral direction.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
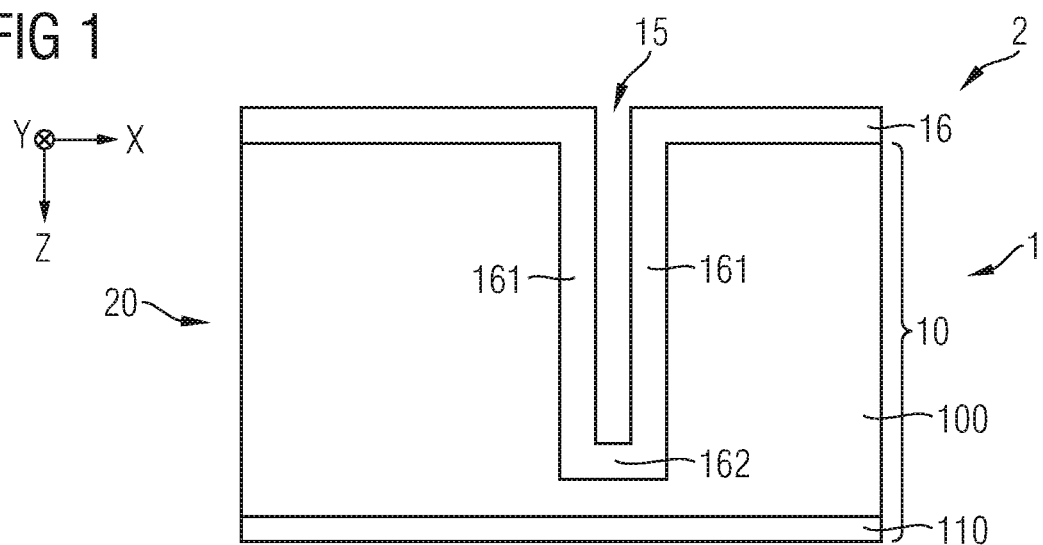
FIG. 1 schematically and exemplarily illustrates steps of a method of processing a power semiconductor device in accordance with one or more embodiments.
Figure 1:
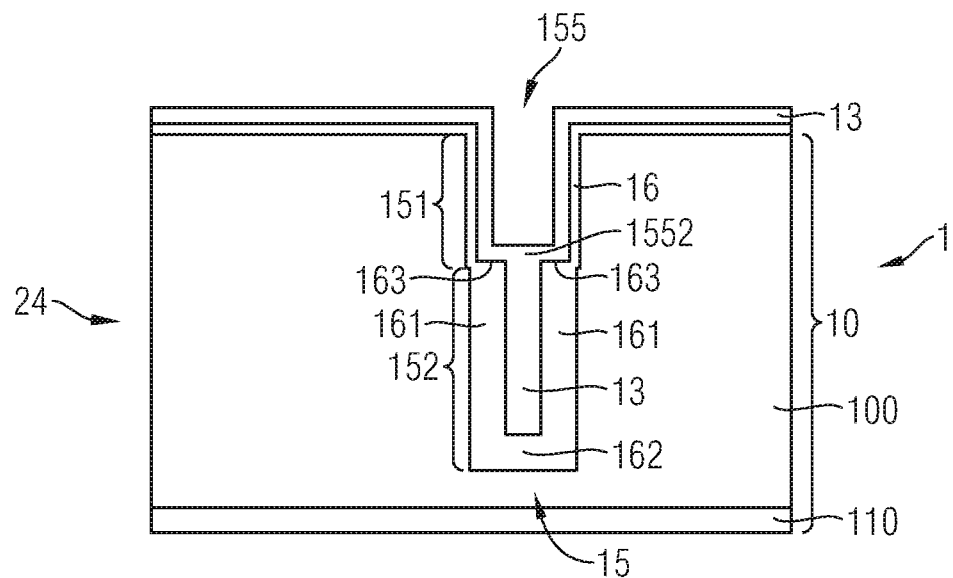
Figure 1:
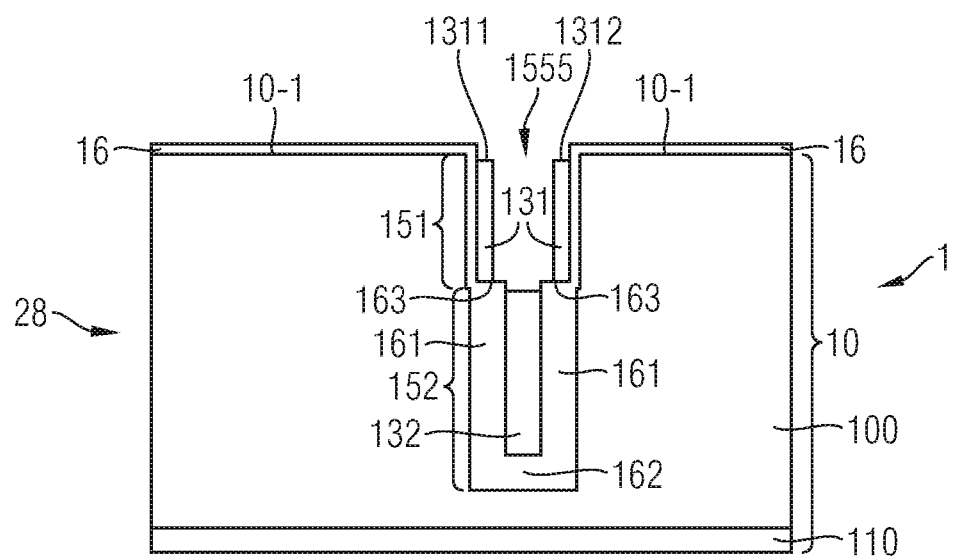

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V. For example, the processed semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing FIG. 1 schematically and exemplarily illustrates a method 2 of processing a power semiconductor device 1—in the following also simply referred to as "semiconductor device"—in accordance with one or more embodiments. Some steps of the method 2 are illustrated by a respective section of a vertical cross-section of the processed component of the semiconductor device 1. The illustrated cross-sections are in parallel to a plane defined by a first lateral direction X and an extension direction Z. The semiconductor device 1 being processed further extends in a second lateral direction Y that is perpendicular to each of the first lateral direction X and the extension direction Z.

In a step 20 of the method 2, a semiconductor body 10 is provided that includes a trench 15. The trench 15 extends into the semiconductor body 10 along the extension direction Z and can comprise an insulator 16, e.g., for insulating an interior region of the trench 15 from the semiconductor body 10.

For example, the semiconductor body 10 includes a drift region 100, e.g., an epitaxial drift region 100 that is arranged on top of a substrate 110. The drift region 100 may comprise dopants of a first conductivity type; e.g., the drift region 100 is n-doped. The trench 15 may extend along the extension direction Z into the drift region 100.

The trench 15 of the semiconductor device 1 may exhibit a needle configuration, according to which the total extension of the trench 15 along the first lateral direction X is approximately in the same range as the total extension of the trench 15 along the second lateral direction Y. For example, when exhibiting the needle configuration, the trench 15 may have, in a plane defined by the first lateral direction X and the second lateral direction Y, one of a rectangular cross-section, a quadratic cross-section, an elliptical cross-section, a circular cross-section and a rectangular cross-section with rounded corners, to name a few possibilities.

In another embodiment, the trench 15 exhibits a stripe configuration, according to which the total extension along the second lateral direction Y amounts to at least a multiple of the total extension along the first lateral direction X. For example, in an embodiment, the semiconductor device 1 exhibits a plurality of trenches 15 in a stripe configuration that are arranged substantially in parallel to each other, e.g., along the first lateral direction X and cross substantially the entire active region of the semiconductor device 1 along the second lateral direction Y, reaching transition regions arranged between the active region and an edge region of the semiconductor device 1. Generally speaking, the skilled person is acquainted with each of the needle configuration and a stripe configuration and, therefore, this aspect is not elucidated in more detail within the present specification.

In an embodiment, the insulator 16 forms trench sidewalls 161 and the trench bottom 162 of the trench 15, as exemplarily illustrated in FIG. 1. Further, as will be explained in more detail below, prior to carrying out the next step 24 described below, the insulator 16 may be structured within the trench 15, e.g., such that it exhibits, within the trench 15, a varying thickness, e.g., a varying lateral thickness, along the extension direction Z.

In step 24, a monolithic electrode zone 13 is provided within the trench 15. This may include carrying out a deposition processing step. The monolithic electrode zone 13 may form a contiguous electrode region within the trench 15. In an embodiment, the monolithic electrode zone 13 covers the trench bottom 162 and the trench sidewalls 161, as illustrated.

For example, the monolithic electrode zone 13 comprises a metal or, respectively, is made of a metal. In an embodiment, the monolithic electrode zone 13 comprises or, respectively, is made out of at least one of tantalum, a silicide, titanium, titaniumnitride, polysilicon, tungsten, aluminum, copper, platinum and cobalt. Further, the monolithic electrode zone 13 can consist of a single layer or a layer stack, wherein the single layer or, respectively, the layers of the stack can be made out of one or more of the aforementioned materials.

In a further step 28, a section of the monolithic electrode zone 13 is removed so as to divide the monolithic electrode zone 13 into at least a first electrode structure 131 and a second electrode structure 132 that are arranged separately and electrically insulated from each other.

Thus, in accordance with one or more embodiments, the two electrode structures 131 and 132 that are arranged separately and electrically insulated from each other can be created by one or more joint processing steps. For example, the two electrode structures 131 and 132 are not created separately, e.g., not sequentially one after the other, but simultaneously. In an embodiment, only a single deposition step is required for creating each of the first electrode structure 131 and the second electrode structure 132.

Further, in accordance with one or more embodiments, the section of the monolithic electrode zone 13 arranged in the trench 15 that is removed within step 28 is not part of an extremity of the monolithic electrode zone 13, but a section arranged in a mid-region (with respect to the extension direction Z) of the monolithic electrode zone 13 within the trench 15. For example, in accordance with the embodiment schematically and exemplarily illustrated in FIG. 1, the section that has been removed from the monolithic electrode zone 13 can be arranged within the lower three quarters of the trench 15. For example, the second electrode structure 132 extends further along the extension direction Z than the first electrode structure 131.

Thus, in accordance with one or more embodiments, dividing the monolithic electrode zone 13 into at least the first electrode structure 131 and the second electrode structure 132 occurs within said mid-region of the trench 15. For example, the trench 15 may exhibit a total extension along the extension direction Z, said total extension amounting to the sum of ten equal tenth parts, of which a proximal tenth part extends along the extension direction Z from the trench opening to the beginning of eight central tenth parts, and the eight central tenth parts extending along the extension direction Z to the beginning of a distal tenth part that extends along the extension direction Z to the trench bottom 162. In an embodiment, dividing the monolithic electrode zone 13 by carrying out the removing step 28 occurs within said central eight tenth parts of the trench 15 or within more central six of said eight central tenth parts. For example, dividing the monolithic electrode zone 13 by carrying out the removing step 28 occurs within the second to fifth tenth parts (said proximal tenth part constituting the first tenth part and said distal tenth part constituting the last, i.e., the tenth part).

It shall be understood that when carrying out step 28, i.e., when removing said section of the monolithic electrode zone 13 within the trench 15, also some other parts of the monolithic electrode zone 13, e.g., those that may be arranged external of the trench 15, e.g., on top of a surface 10-1 of the semiconductor body 10 or, respectively, on top of the insulator 16, may also be removed within step 28, as illustrated in FIG. 1. For example, in an embodiment, a section of the monolithic electrode zone 13 that extends out of the trench 15 and that is supported by the surface 10-1 of the semiconductor body 10-1 or, respectively, by a section of the insulator 16 arranged on top of the surface 10-1 of the semiconductor body 10, can be maintained during said removing step 28, e.g., by using a lithography step. For example, the latter variant is schematically and exemplarily illustrated in FIG. 4a. In another embodiment that is schematically and exemplarily illustrated in FIG. 1, the removing step 28 is carried out such that the first electrode structure 131 does not extend out of the trench 15, but is entirely included within the trench 15. Both variants of carrying out the removing step 28 are possible, which one of the variants is eventually carried out may depend on the way of contacting the first electrode structure 131 and/or the second electrode structure 132, as will be explained in more detail below with respect to FIG. 3, FIG. 4a and FIG. 4c.

In any case, the partial removing of the monolithic electrode zone 13 may be carried out by using a suitable mask. Further, said removing may include carrying out an anisotropic etch processing step.

In the following, some further optional aspects of the method 2 shall be explained in more detail with respect to FIGS. 1-5.

Providing the semiconductor body 10 within step 20 may include carrying out an epitaxial deposition for forming the drift region 100, and an etch processing step for forming the trench 15, and/or one or more oxidation and/or deposition processes for forming the insulator 16.

Figure 2:
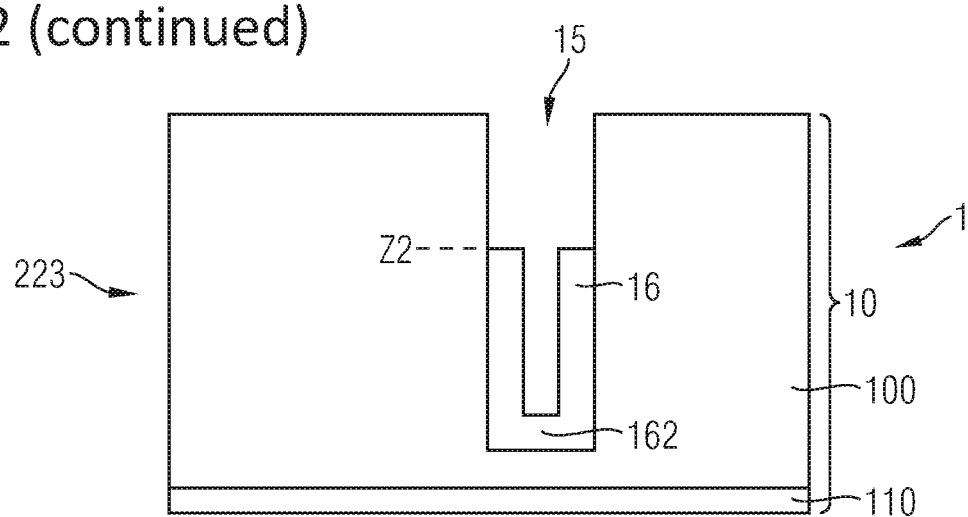
FIG. 2 schematically and exemplarily illustrates steps of a method of processing a power semiconductor device in accordance with one or more embodiments.
Figure 2:
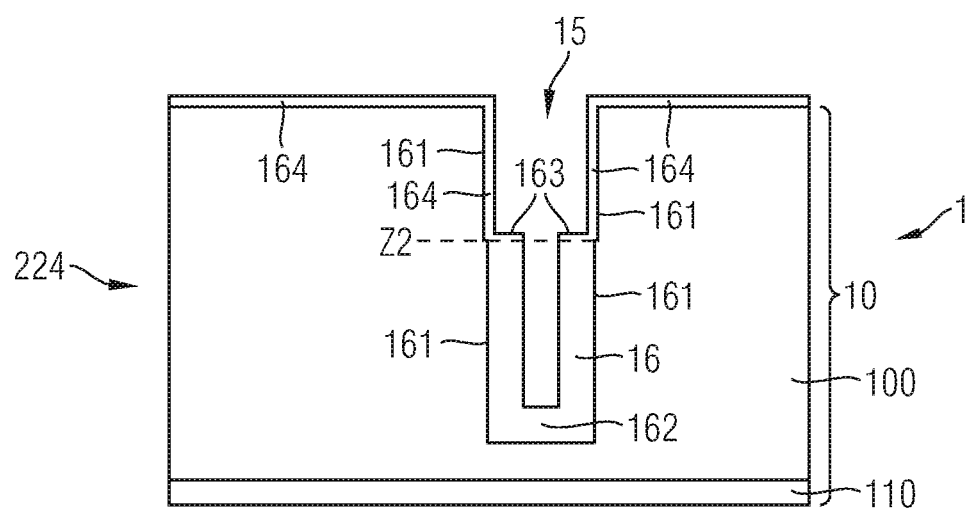

An exemplary way of structuring (step 22) the insulator 16 prior to providing the monolithic electrode zone 13 is schematically illustrated in FIG. 2. Accordingly, in a step 221, the trench 15 may be partially filled with sacrificial material 154. For example, the sacrificial material 154 is selectively etchable with respect to each of the semiconductor body 10 and the insulator 16, e.g., selectively etchable with respect to each of silicon and silicon oxide, and comprises at least one of carbon and nitride.

Said partial filling may be carried out by initially filling the entire trench 15 with the sacrificial material 154 (cf. step 221-1) and by subsequently carrying out an etch process (cf. step 221-2) for removing an upper part of the sacrificial material 154, e.g., down to a level Z1, so as to create a recess 1541 that this laterally confined by the insulator 16 along the first lateral direction X and vertically confined by the remaining sacrificial material 154 along the extension direction Z. For example, during this etch process, the insulator 16 remains substantially unmodified.

In an embodiment, after filling the entire trench 15 with the sacrificial material 154 (step 221-1) and prior to carrying out the etch process (step 221-2), the sacrificial material 154, e.g., its part that forms a surface substantially in parallel to the semiconductor body surface 10-1, e.g., a planar part of the semiconductor material 154, may be subjected to a selective planarization processing step (not illustrated). This may allow for adjusting the total extension of the sacrificial material 154 along the extension direction Z more accurately, and said level Z1 reached by means of the subsequent etch process (step 221-2) can, thus, also be adjusted more accurately. Thereby, a Qgd-parameter of the semiconductor device 1 may be controlled in an exact manner.

Then, in step 222, an insulator etch step can be carried out for removing a section of the insulator 16. For example, during the insulator etch step, trench sidewalls 161 formed by the insulator 16 and arranged in an upper part 151 of the trench 15 are removed, wherein trench sidewalls 161 formed by the insulator 16 and arranged in a lower part 152 of the trench 15 remain within the trench 15, as illustrated in FIG. 2.

In an embodiment, said section of the insulator 16 being removed in step 222 may include those regions that are arranged within the trench 15 and above the sacrificial material 154 and also a region that slightly extends below the sacrificial material 154. For example, the insulator 16 is etched down to a level Z2, wherein Z2 can be, e.g., equal to or greater than Z1. For example, level Z2 may constitute an upper contact level where the second electrode structure 132 may eventually be contacted, which will be explained in more detail below.

Further, step 222 may also include removing the insulator 16 that may be arranged external of the trench 15, e.g., on a surface 10-1 of the semiconductor body 10. For example, during step 222, each of the semiconductor body 10 and the sacrificial material 154 remains substantially unmodified.

Step 222 of removing the section of the insulator 16 may include carrying out at least one of an anisotropic etch processing step and an isotropic wet etch processing step.

Thus, at this processing stage, a lower part 152 of the trench 15 may be completely filled by the insulator 16 and the sacrificial material 154, wherein the sacrificial material 154 may be isolated from the semiconductor body 10 by the insulator 16. In an upper part 151 of the trench 15, however, there can be substantially a recess into which only the sacrificial material 154 extends, wherein a transition between the upper part 151 and the lower part 152 can be at said level Z2.

In a next step 223, a further etch step can be carried out for eliminating the sacrificial material 154 within the trench 15. In an embodiment, the entire sacrificial material 154 is removed during step 223. For example, this further etch step includes at least one of a selective (e.g., selective to the material of the insulator 16 and the material of the semiconductor body 10) etch processing step and a wet etch processing step.

Then, in step 224, an oxide 164 can be created in a region where said insulator section has previously, e.g., in step 222, been removed. This can be done by depositing the oxide 164 and/or by carrying out a thermal oxidation step. Instead of the oxide 164, also another insulator material may be created in said region. Thus, the created oxide 164 may contact the remaining insulator 16. In the following, the formulation "insulator 16" may, thus, also comprise said created oxide 164. In other words, the oxide 164 may form a part of the insulator 16. For example, the insulator 16 then forms the entire trench sidewalls 161 as well as the trench bottom 162 of the trench 15. In accordance with one or more embodiments, the section of the insulator 16 that eventually electrically insulates the first electrode structure 131 from the semiconductor body 10 is created prior to creating the first electrode structure 131 within the trench 15. This may allow for shifting the thermal budget of the oxide creation step 224 before the step of providing the monolithic electrode zone 13, e.g., before depositing metal, in accordance with one or more embodiments.

In an embodiment, providing the monolithic electrode zone 13 may occur directly after forming the oxide 164.

Structuring the insulator 16, for example in accordance with the embodiment schematically illustrated in FIG. 2, may yield at least one step 163 within the trench sidewalls 161. This step 163 within the trench sidewalls 161 can be arranged approximately at the level Z2. Thus, the trench sidewalls 161 may exhibit a step profile along the extension direction Z. Accordingly, the thickness of the insulator 16 in the first lateral direction X may exhibit a sharp increase at the level Z2.

Regarding now again method step 24 schematically and exemplarily illustrated in FIG. 1, after providing the monolithic electrode zone 13 within the trench 15, the provided monolithic electrode zone 13 may form a well structure 155, e.g., in the upper part 151 of the trench 15. In the vertical cross-section schematically illustrated, the monolithic electrode zone 13 may thus exhibit a fork-like form, completely filling, together with the insulator 16, the lower part 152 of the trench 15 and leaving a recess in the upper part 151 of the trench 15 by means of its one or more "tines". But, it shall be understood that the monolithic electrode zone 13 must not necessarily fill the entire lower part 152 of the trench 15. In an embodiment (not illustrated), the monolithic electrode zone 13 may form an internal recess structure that leaves a cavity within the lower part 152 of the trench 15, wherein said cavity may be filled with an insulator material, for example.

Further, the well structure 155 of the monolithic electrode zone 13 in the upper part 151 of the trench 15 may comprise a bottom 1552 that may be supported by, e.g., the steps 163 of the insulator 16. For example, in step 28, when a section of the monolithic electrode zone 13 may be removed within the trench 15 so as to divide the monolithic electrode zone 13 into at least the first electrode structure 131 and the second electrode structure 132, at least a part of the bottom 1552 of the well structure 155 can be removed, as schematically and exemplarily illustrated in FIG. 1.

By removing the bottom 1552 of the well structure 155 at least partially, e.g., by carrying out an anisotropic etch processing step, the monolithic electrode zone 13 may become divided into the first electrode structure 131 and the second electrode structure 132, wherein said two electrode structures 131 and 132 can then be spatially displaced from each other along the extension direction Z. In an embodiment, the first electrode structure 131 and the second electrode structure 132 are spatially displaced from each other along the extension direction Z such that they do not exhibit a common extension range along the extension direction Z. For example, the second electrode structure 132 may be arranged entirely below the first electrode structure 131, e.g., below the well structure 155 that has previously been formed by the monolithic electrode zone 13 within the upper part 151 of the trench 15.

As has been explained above, due to the structured insulator 16, the monolithic electrode zone 13 may be provided within the trench 15 such that it at least partially or completely fills the lower part 152 and only covers the trench sidewalls 161, which may be formed, e.g., by the oxide 164, in the upper part 151 of the trench 15, leaving a recess 1555 within the upper part 151 of the trench 15. Thus, when removing the section of the monolithic electrode zone 13, e.g., at least a part of the bottom 1552 of the well structure 155, the two electrode structures 131, 132 that are arranged separately from each other may come into being, wherein the first electrode structure 131 may comprise a first electrode 1311 and a second electrode 1312 that are each arranged spatially displaced from the second electrode structure 132. Further, the first electrode 1311 can be arranged at one of the trench sidewalls 161 and the second electrode 1312 can be arranged at the other one of the trench sidewalls 161, thereby, e.g., laterally confining the recess 1555.

In an embodiment, neither the first electrode 1311 nor the second electrode 1312 has a common extension range with second electrode structure 132 along the first lateral direction X. For example, a distance along the first lateral direction X between the first electrode 1311 and the second electrode 1312 is greater than a total extension of the second electrode structure 132 in said first lateral direction X.

Figure 3:
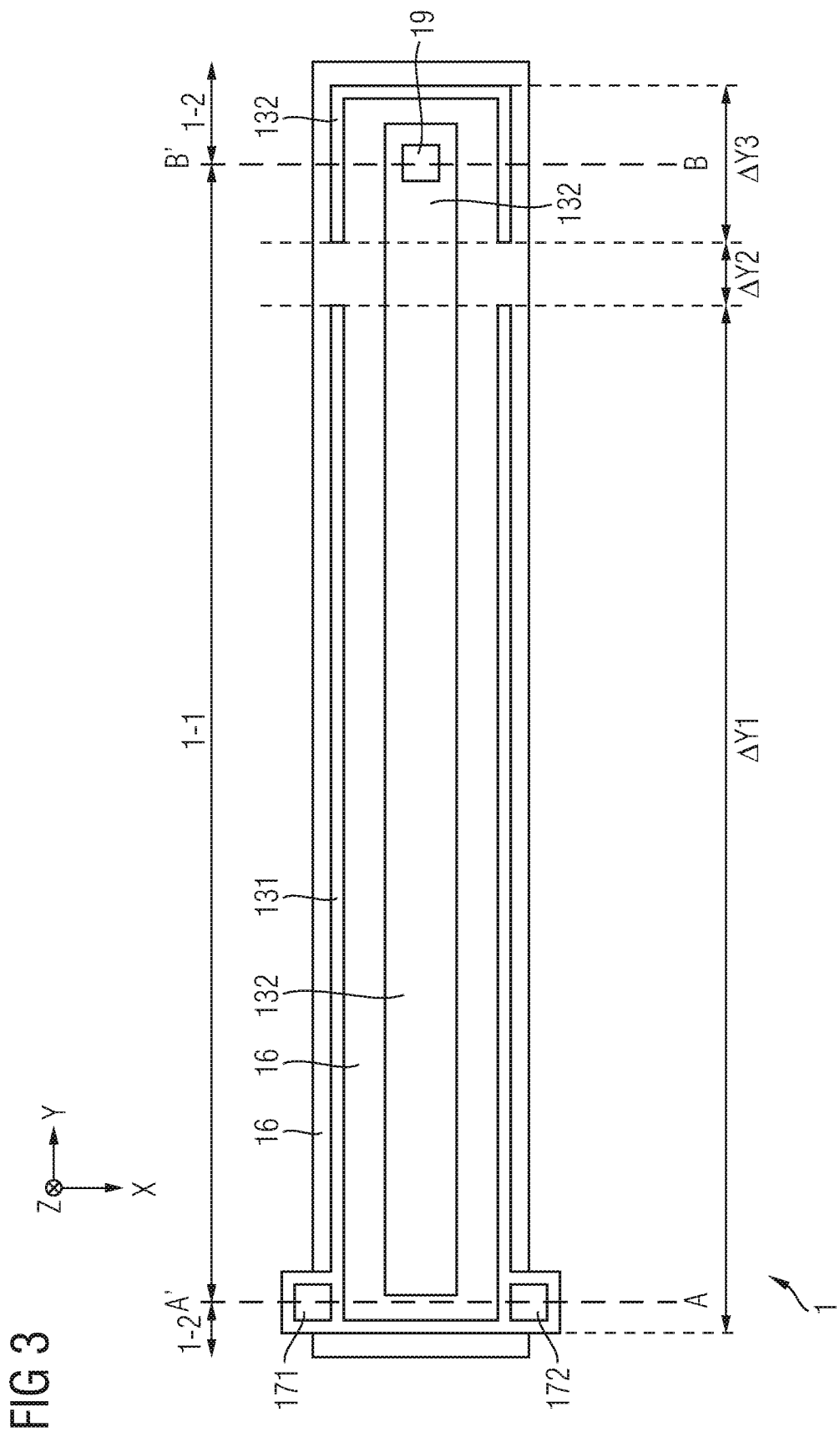
FIG. 3 schematically and exemplarily illustrates a section of a horizontal projection of a power semiconductor device in accordance with one or more embodiments.

FIG. 3 schematically and exemplarily illustrates a section of a horizontal projection of a power semiconductor device 1 in accordance with one or more embodiments, e.g., a power semiconductor device 1 that has been processed in accordance with an embodiment of the method 2 exemplarily described with respect to FIGS. 1 and 2 above. The horizontal projection may be in parallel to a plane defined by the two lateral directions X and Y.

In accordance with the embodiment illustrated in FIG. 3, the trench 15 exhibits a stripe configuration. As has been explained above, the trench 15 may cross substantially the entire active region 1-1 of the semiconductor device 1 along the second lateral direction Y, reaching transition regions arranged between the active region 1-1 and an edge region 1-2 of the semiconductor device 1.

As illustrated, at least in a part of the active region 1-1, the first electrode structure 131 and the second electrode structure 132 may be spatially displaced from each other along the first lateral direction X, e.g., such that they do not overlap along the first lateral direction X.

Further, the trench 15 may exhibit a total extension range along the second lateral direction Y amounting to the sum of the three lateral subregions ΔY1, ΔY2 and ΔY3 indicated in FIG. 3. In an embodiment, during step 28, the following sections of the monolithic electrode region 13 are removed: In the first subregion ΔY1, only said bottom 1552 of the well structure 155 (as exemplarily illustrated in FIG. 1) is at least partially removed, e.g., by carrying out an anisotropic etch processing step; in the second subregion ΔY2, the entire well structure 155 is removed, wherein the section of the monolithic electrode region 13 arranged in the lower part 152 remains within the trench 15; and in the third subregion ΔY3, no parts of the monolithic electrode region are removed. In another embodiment, also in the third subregion ΔY3, the entire well structure 155 is removed, as in the second subregion ΔY2. Removing the entire well structure 155 in the second subregion ΔY2 and/or in the third subregion ΔY3 may comprise, e.g., carrying out an additional isotropic etch step masked with a lithography step.

For example, the first subregion ΔY1 amounts to at least 70%, to at least 90% or to at least 98% of the total extension range of the trench 15 along the second lateral direction Y; the second subregion ΔY2 amounts to less than 5%, to less than 2% or to less than 1% of the total extension range of the trench along the second lateral direction Y; and the third subregion ΔY3 amounts to less than 5%, to less than 2% or to less than 1% of the total extension range of the trench along the second lateral direction Y. Thus, in an embodiment, in a predominant portion of the trench 15, the trench 15 includes each of the first electrode structure 131 and the second electrode structure that are arranged separately and electrically insulated from each other, e.g., spatially displaced from each other such that they do not overlap along the extension direction Z.

Figure 4A:
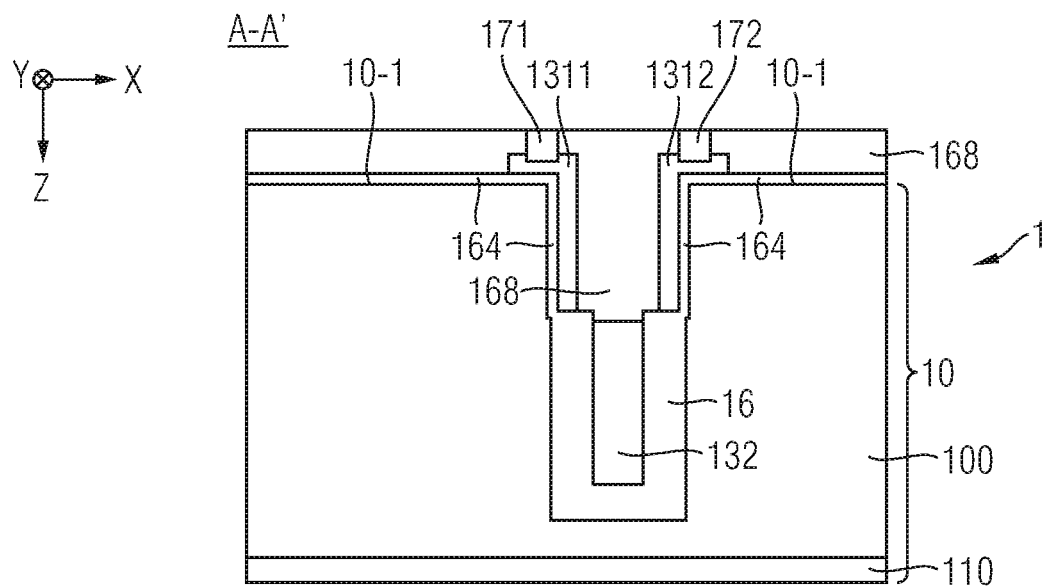
FIG. 4a-4c each schematically and exemplarily illustrate a section of a vertical cross-section of a power semiconductor device in accordance with one or more embodiments.
Figure 4B:
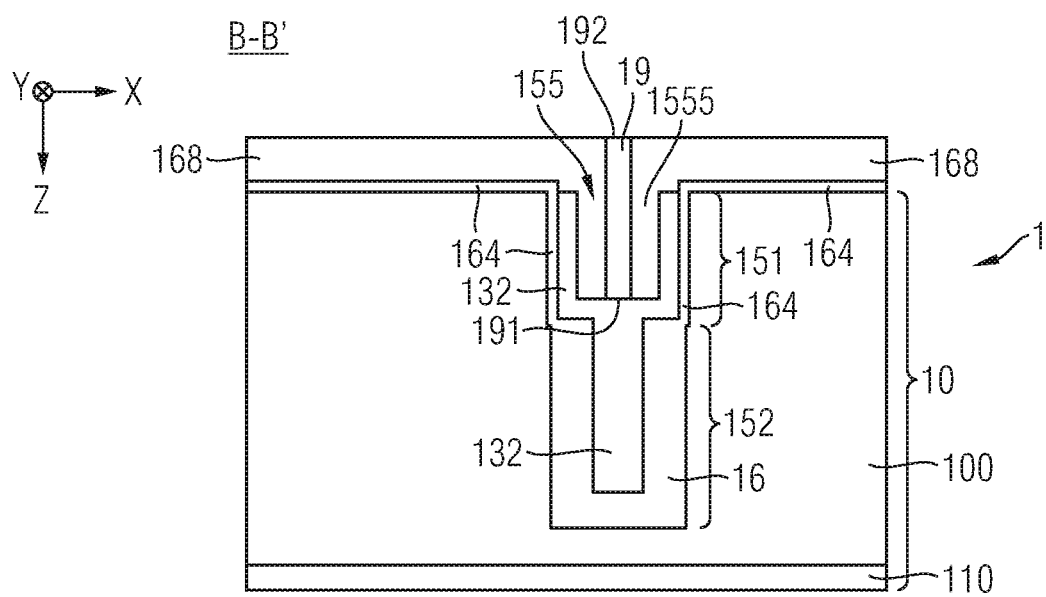
Figure 4C:
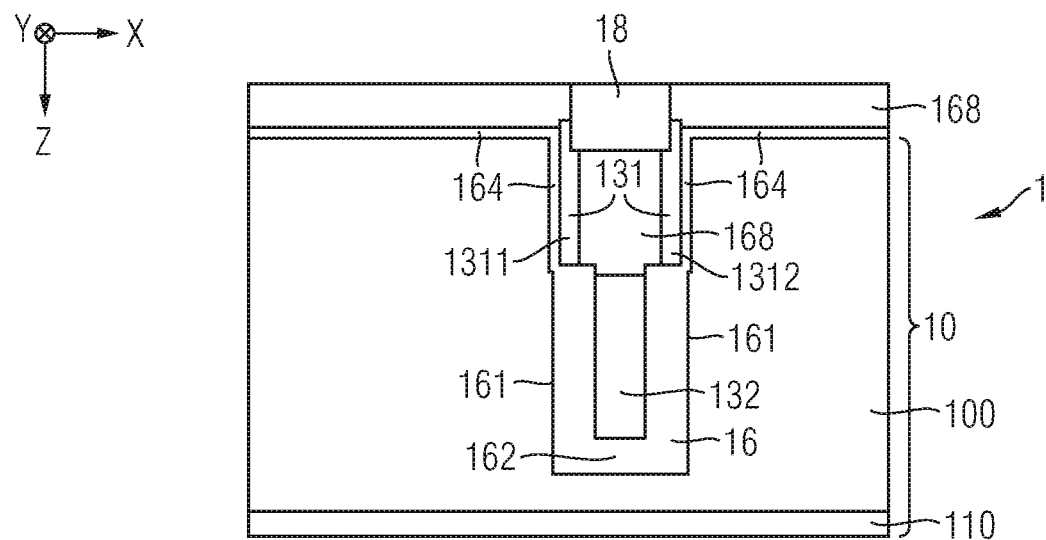

Further, the method 2 may include providing contacting means for contacting each of the first electrode structure 131 and the second electrode structure 132 from external of the trench 15. In other words, the power semiconductor device 1 may include contacting means for contacting each of the first electrode structure 131 and the second electrode structure 132 from external of the trench 15. Said contacting means or, respectively, exemplarily ways of providing said contacting means shall now be described in more detail, also with respect to FIGS. 4a-c, wherein FIG. 4a schematically and exemplarily illustrates a section of a vertical cross-section of a power semiconductor device 1 along a plane AA' (indicated in FIG. 3) in accordance with one or more embodiments, FIG. 4b schematically and exemplarily illustrates a section of a vertical cross-section of a power semiconductor device 1 along a plane BB' (indicated in FIG. 3) in accordance with one or more embodiments; and wherein FIG. 4c schematically and exemplarily illustrates a section of a vertical cross-section of a power semiconductor device in accordance with one or more embodiments For example, providing the contacting means may include providing at least one of a lateral contact pad 171, 172, a central contact pad 18 and a contact pin 19. Further, prior to providing the contacting means, the recess 1555 formed by the well structure 155 in the upper part 151 of the trench 15 may be filled with an insulator material 168, as illustrated in each of FIGS. 4a-c. For example, the insulator material 168 may electrically insulate the first electrode structure 131 from the second electrode structure 132. In another embodiment, said recess 1555 is not completely filled with an insulator material, but may exhibit one or more cavities. In an embodiment, the insulator material 168 may include an inter-layer dielectric. Further, in order to create the contact pin 19 within the trench 15, a deep oxide etch process may be carried out, e.g., a deep oxide etch process exhibiting low overlay tolerance. Additionally or alternatively, the second electrode structure 132 may be contacted with higher overlay tolerance, e.g., via a separate lithographic and isotropic etch step, in a region where the entire well structure has been removed, e.g., within the second lateral subregion ΔY2 indicated in FIG. 3.

For example, referring to FIG. 4a, each of the one or more lateral contact pads 171, 172 is entirely arranged external of the trench 15 and may contact the first electrode structure 131, e.g. in a region where the first electrode structure 131 extends out of the trench 15 along and against the first lateral direction X, thereby forming, e.g., lateral landing pads supported by the surface 10-1 of the semiconductor body 10, e.g., mounted on the oxide 164 that may cover said surface 10-1. For example, the contact pads 171, 172 may be arranged on top of said lateral landing pads that may be formed by the first electrode structure 131. As has been explained above, the removing step 28 exemplary illustrated in FIG. 1 can be carried out such that said regions of the first electrode structure 131 arranged slightly external of the trench 15 remain. In an embodiment, the one or more lateral contact pads 171, 172 are provided at a transition region from the active region 1-1 to the edge region 1-2, as illustrated in FIG. 3. Further, the lateral contact pads 171, 172 may be electrically connected to a driver (not illustrated) that may provide a control signal to the first electrode structure 131. In an embodiment, a first lateral contact pad 171 may be in contact with the first electrode 1311, and the second lateral contact pad 172 may be in contact with the second electrode 1312 of the first electrode structure 131. The two lateral contact pads 171 and 172 may be arranged separately from each other. It shall be understood that the first electrode 1311 may be electrically insulated from the second electrode 1312 such that the first electrode 1311 may be provided with an electrical potential different from an electrical potential provided to the second electrode 1312, in accordance with one or more embodiments.

Regarding now FIG. 4c, in a further embodiment, a central contact pad 18 may additionally or alternatively be provided. For example, the central contact pad 18 may extend into the trench 15 and may contact the first electrode structure 131, e.g., each of its first electrode 1311 and its second electrode 1312, as illustrated. For example, when choosing this way of contacting the first electrode structure 131, during the removing step 28, it must not necessarily be ensured that the first electrode structure 131 extends out of the trench 15 along and against the first lateral direction X. Rather, the step of removing the section of the monolithic electrode zone 13 can be carried out such that no part of the monolithic electrode zone 13 extends out of the trench 15 but rather that the electrode structures remain entirely within the trench 15. Further, as an alternative or as an additional way of contacting the first electrode structure 131, each of its first electrode 1311 and its second electrode 1312 can be contacted separately with a respective contact plug, e.g., by carrying out a high precision lithography processing step.

At this point, it shall be understood that both ways of contacting the first electrode structure 131, namely by means of the one or more lateral landing paths 171, 172 and/or by means of the central contact pad, may analogously be applied for contacting the second electrode structure 132 if, as illustrated in FIG. 3, in the third subregion ΔY3 the monolithic electrode zone 13 is not divided during carrying out said removing step 28.

A further possibility of contacting the second electrode structure 132 in accordance with one or more embodiments shall now be explained with respect to FIG. 3 and FIG. 4b. For example, a contact pin 19 may be formed within the recess 1555 formed in the upper part 151 of the trench 15 by the well structure 155. For example, the contact pin 19 is arranged within the trench 15 such that it laterally overlaps along the first lateral direction X and along with the second lateral direction Y with the second electrode structure 132 that is arranged in the lower part 152 of the trench 15. Further, the contact pin 19 may be spatially displaced from the first electrode structure 131 and can be electrically insulated from the first electrode structure 131, e.g., by means of the insulating material 168. The contact pin 19 may thus contact the second electrode structure 132 with its first end 191 within the trench 15 and be configured, at its second end 192 arranged external of the trench 15, to be contacted, e.g., by a first load terminal of the semiconductor device 1, as will be explained below.

In an embodiment, one or more of the lateral contact pads 171, 172, the central contact pad 18 and the contact pin 19 are made of a metal.

Figure 5:
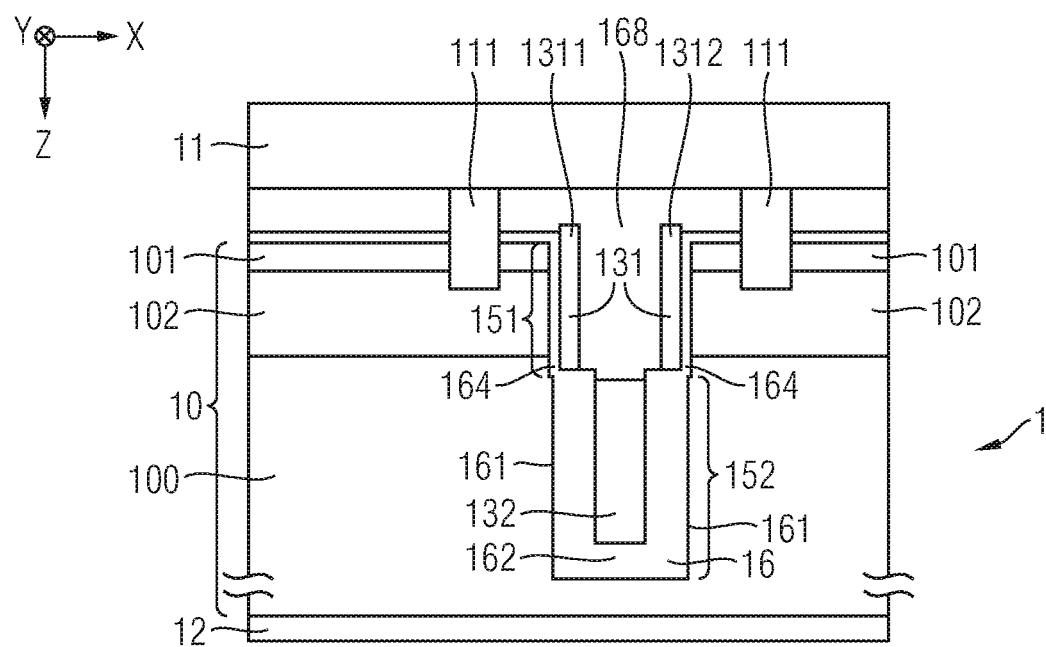
FIG. 5 schematically and exemplarily illustrates a section of a vertical cross-section of a power semiconductor device in accordance with one or more embodiments

FIG. 5 schematically and exemplarily illustrates a section of a vertical cross-section of a power semiconductor device 1 in accordance with one or more embodiments.

For example, the semiconductor device 1 has been processed in accordance with an embodiment of the method 2 elucidated above. Thus, what has been stated above regarding the method 2 and the processed semiconductor device may equally apply to the semiconductor device 1 schematically illustrated in FIG. 5.

The power semiconductor device 1 may comprise a semiconductor body 10 coupled to a first load terminal 11 and a second load terminal 12 and configured to conduct a load current between said terminals 11, 12. The semiconductor body 10 may exhibit those regions that are necessary for forming, e.g., one or more of an IGBT-, an RC-IGBT-, a MOSFET-, a diode-, a MGD-configuration or a configuration derived therefrom that are known to the skilled person. To this end, the semiconductor body 10 may include a buffer region (not illustrated), also known as field-stop region, arranged in proximity to the second load terminal 12, and/or one or more emitter regions also arranged in proximity to the second load terminal. Further, in proximity to the first load terminal 11, there may be arranged each of a source region 101 and a channel region 102. For example, the source region 101 is electrically connected to the first load terminal 11, e.g., by means of one or more plugs 111. The channel region 102 may be arranged so as to isolate the source region 101 from a drift region 100 of the semiconductor body 10. For example, the drift region 100 and the channel region 102 a complementary doped; e.g., the drift region 100 comprises dopants of the first conductivity type and the channel region 102 comprises dopants of the second conductivity type. Further, the source region 101 may also be a semiconductor source region 101 and can comprise dopants of the same conductivity type as the drift region 100, e.g., at a higher dopant concentration than the drift region 100.

The power semiconductor device 1 may include a trench 15 extending into the semiconductor body 10 along the extension direction Z and comprising an insulator 16, e.g., for insulating an interior region of the trench 15 from the semiconductor body 10. For example, the load current may traverse the semiconductor body 10 along or against the extension direction Z, which can be a vertical direction. Each of the source region 101 and the channel region 102 may be arranged in contact with the trench sidewalls 161.

Further, a first electrode structure 131 can be included in the trench 15 and configured to control the load current. Each of the source region 101 and the channel region 102 may be arranged such that they overlap with the first electrode structure 131. For example, for setting the power semiconductor device 1 into a conducting state, during which the load current in a forward direction may be conducted between the load terminals 11 and 12, the first electrode structure 131 may be provided with a control signal having a voltage within a first range so as to induce a load current path within the channel region 102, e.g., an inversion channel. In an embodiment, for setting the power semiconductor device 1 into a blocking state, during which a forward voltage applied to the load terminals 11, 12 may be blocked and flow of the load current in the forward direction is inhibited, the first electrode structure 131 may be provided with the control signal having a voltage within a second range different from the first range so as to cut off the load current path in the channel region 102. Then, the forward voltage may induce a depletion region at a junction formed by a transition between the channel region 102 and the drift region 100 of the power semiconductor device, wherein the depletion region is also called "space charge region" and may mainly expand into the drift region 100 of the semiconductor device 1. In this context, the channel region 102 is frequently also referred to as a "body region", in which said load current path, e.g., an inversion channel, may be induced by the control signal to set the semiconductor device 1 in the conducting state. Without the load current path in the channel region 102, the channel region 102 may form a blocking junction with the drift region 100.

In addition, a second electrode structure 132 may be included in the trench 15 and can be arranged separately and electrically insulated from the first electrode structure 131. The first electrode structure 131 and the second electrode structure 132 can be spatially displaced from each other along the extension direction Z such that they do not exhibit a common extension range along the extension direction Z.

The second electrode structure 132 may extend further along the extension direction Z than the first electrode structure 131. In other words, the second electrode structure 132 may be arranged in a lower part 152 of the trench 15 and the first electrode structure 131 may be arranged in an upper part 151 of the trench 15.

Further the insulator 16 may form trench sidewalls 161 and a trench bottom 162, and the first electrode structure 131 may comprises at least two electrodes, a first electrode 1311 being arranged at one of the trench sidewalls 161 and a second electrode 1312 being arranged at the other one of the trench sidewalls 161. As has been explained above, in the upper part 151 of the trench 15, the insulator 16 may be formed by the oxide 164 that may have been produced during method step 224 illustrated in FIG. 2. A distance along the first lateral direction X between the first electrode 1311 and the second electrode 1312 may be greater than a total extension of the second electrode structure 132 in said first lateral direction X. Thus, in a vertical cross-section, neither the first electrode 1311 nor the second electrode 1312 has a common extension range with second electrode structure 132 along the first lateral direction X, in accordance with one or more embodiments.

In an embodiment, the first electrode 1311 is configured to induce a first inversion channel in a first section of the channel region 102 adjacent to one of the trench sidewalls 161, and the second electrode 1312 is configured to induce a second inversion channel in a second section of the channel region 102 adjacent to the other one of the trench sidewalls 161. For example, the first inversion channel exhibits a cut-off voltage different from the cut-off voltage of the second inversion channel. To this end, the effective thickness of the oxide 164 insulating the first electrode 1311 from the semiconductor body 10 may be different from the effective thickness of the oxide 164 insulating the second electrode 1312 from the semiconductor body 10. Herein, a comparison between the "effective thicknesses" of the oxide 164 may mean that the product of the dielectric constant of the dielectric used for the oxide 164 insulating the first electrode 1311 from the first section of the channel region 102 multiplied with its thickness is compared to the product of the dielectric constant of the dielectric used for the oxide 164 insulating the second electrode 1312 from the second section of the channel region 102 multiplied with its thickness. In case said dielectrics being made of the same material, e. g. a silicon dioxide, this reduces to a comparison of the respective thicknesses. In case, e. g., the dielectric used for the oxide 164 insulating the first electrode 1311 from the first section of the channel region 102 has a different dielectric constant than the dielectric used for the oxide 164 insulating the second electrode 1312, the said thicknesses may be identical to each other, while the cut-off voltages still differ.

Each of the first electrode structure 131 and the second electrode structure 132 may comprise a metal.

In an embodiment, the first electrode structure 131 is electrically connected to a driver (not illustrated) configured to provide said control signal, e.g., by applying a voltage between the first load terminal 11 and the first electrode structure 131. It shall be understood that the first electrode structure 131 can be electrically insulated from each of the first load terminal 11 and the second load terminal 12. Thus, the first electrode structure 131 may act as a control electrode structure, e.g., a gate electrode structure.

The second electrode structure 132 can be electrically connected to another electrical potential as the first electrode structure 131; e.g., the second electrode structure 132 is electrically connected to the first load terminal 11. Thus, the second electrode structure 132 may act as a field electrode structure, e.g., a field plate structure.

For contacting the first electrode structure 131 and the second electrode structure 132, said contacting means that have been described with respect to the method 2 can be provided. For example, the first electrode structure 131 is contacted by means of the central contact pad 18 exemplarily illustrated in FIG. 4c, and the second electrode structure 132 may be contacted by the contact pin 19 exemplarily illustrated in FIG. 4b.

Even though, in the above, aspects of a semiconductor device exhibiting a trench in a stripe configuration and aspects of processing such semiconductor device have been explained, it shall be understood that the principles, e.g., the step of removing a section of the monolithic electrode zone 13, e.g., step 28, and/or the step of structuring the insulator 16, e.g., step 22, including steps 221-1, 221-2, 222, 223 and 224, as laid out above may also be applied to trench exhibiting a needle configuration.

For example, by using metal as a material for the monolithic electrode zone 13, each of the first electrode structure 131 and the second electrode structure 132 may exhibit a comparatively low resistance, e.g., a lower resistance than such resistance that is achievable when using a semiconductor material, e.g., polysilicon.

The embodiments described above include the recognition that by using a first deposition for forming a first electrode structure within a trench and by using a separate deposition for forming a second electrode structure within the trench afterwards can be comparatively costly and complex. Further, when using a semiconductor material for the electrode structures, only comparatively high resistance values can be achieved.

In accordance with one or more embodiments, each of the second electrode structure 132, e.g., a field plate, and the first electrode structure 131, e.g., one or two gate electrodes, can be simultaneously be provided within the same trench, e.g., while at the same time avoiding the need for a high temperature process. Further in accordance with one or more embodiments, a metal is used as a material for the monolithic electrode zone 13, i.e., as a material for each of the first electrode structure 131 and the second electrode structure 132.

In the above, embodiments pertaining to semiconductor device processing methods were explained. For example, these semiconductor devices are based on silicon (Si). Accordingly, a monocrystalline semiconductor region or layer, e.g., the semiconductor body 10, the drift region 100, the substrate 110, the source region 101, the channel region 102 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 110, 101 and 102 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1−x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a semiconductor body coupled to a first load terminal and a second load terminal and configured to conduct a load current between the first load terminal and the second load terminal;
    a trench extending into the semiconductor body along an extension direction and comprising an insulator;
    a first electrode structure included in the trench and configured to control the load current; and
    a second electrode structure included in the trench and arranged separately and electrically insulated from the first electrode structure,
    wherein the first electrode structure and the second electrode structure are spatially displaced from each other along the extension direction such that they do not have a common extension range along the extension direction,
    wherein each of the first electrode structure and the second electrode structure comprises a metal.

2. The power semiconductor device of claim 1, wherein the second electrode structure extends further along the extension direction than the first electrode structure.

3. The power semiconductor device of claim 1, wherein the insulator forms trench sidewalls and a trench bottom, and wherein the first electrode structure comprises at least two electrodes, a first one of the at least two electrodes being arranged at one of the trench sidewalls and a second one of the at least two electrodes being arranged at the other one of the trench sidewalls.

4. The power semiconductor device of claim 3, wherein a distance along a first lateral direction between the first electrode and the second electrode is greater than a total extension of the second electrode structure in the first lateral direction.

5. The power semiconductor device of claim 3, wherein in a vertical cross-section, neither the first electrode nor the second electrode has a common extension range with the second electrode structure along the first lateral direction.

6. The power semiconductor device of claim 3, further comprising a central contact pad arranged between the first electrode and the second electrode and in contact with each of the first and the second electrodes, wherein the central contact pad extends into the trench.

7. The power semiconductor device of claim 1, further comprising a lateral contact pad arranged entirely external of the trench and in contact with the first electrode structure.

8. The power semiconductor device of claim 1, wherein the second electrode structure is electrically connected to the first load terminal.

9. The power semiconductor device of claim 1, wherein the insulator has a step profile along the extension direction, wherein the step profile defines an upper part of the trench and a lower part of the trench, and wherein the first electrode structure is arranged in the upper part of the trench and the second electrode structure is arranged in the lower part of the trench.

10. The power semiconductor device of claim 1, wherein the first electrode structure is a control electrode structure disposed along sidewalls of the trench in an upper part of the trench, wherein the second electrode structure is a field electrode structure spaced inward from and below the control electrode structure in a lower part of the trench, and wherein the control electrode structure and the field electrode structure are electrically connected to different potentials.

11. A power semiconductor device, comprising:
    a semiconductor body including a trench that extends into the semiconductor body along an extension direction and comprising an insulator; and
    a first electrode structure and a second electrode structure formed from a monolithic electrode zone within the trench,
    wherein the first electrode structure and the second electrode structure of the monolithic electrode zone are arranged separately and electrically insulated from each other within the trench, wherein the first electrode structure is arranged in an upper part of the trench and the second electrode structure is arranged in a lower part of the trench, wherein the first electrode structure and the second electrode structure are vertically misaligned in the trench.

12. The power semiconductor device of claim 11, wherein the second electrode structure extends further along the extension direction than the first electrode structure.

13. The power semiconductor device of claim 11, wherein the insulator forms trench sidewalls and a trench bottom, and wherein the first electrode structure comprises at least two electrodes, a first one of the at least two electrodes being arranged at one of the trench sidewalls and a second one of the at least two electrodes being arranged at the other one of the trench sidewalls.

14. The power semiconductor device of claim 13, wherein a distance along a first lateral direction between the first electrode and the second electrode is greater than a total extension of the second electrode structure in the first lateral direction.

15. The power semiconductor device of claim 13, wherein in a vertical cross-section, neither the first electrode nor the second electrode has a common extension range with the second electrode structure along the first lateral direction.

16. The power semiconductor device of claim 13, further comprising a central contact pad arranged between the first electrode and the second electrode and in contact with each of the first and the second electrodes, wherein the central contact pad extends into the trench.

17. The power semiconductor device of claim 11, further comprising a lateral contact pad arranged entirely external of the trench and in contact with the first electrode structure.

18. The power semiconductor device of claim 11, wherein the insulator has a step profile along the extension direction, and wherein the step profile defines the upper part of the trench and the lower part of the trench.

19. The power semiconductor device of claim 11, wherein each of the first electrode structure and the second electrode structure comprises a metal.

20. A power semiconductor device, comprising:
a semiconductor body coupled to a first load terminal and a second load terminal and configured to conduct a load current between the first load terminal and the second load terminal;
a trench extending into the semiconductor body along an extension direction and comprising an insulator;
a control electrode structure included in the trench and configured to control the load current; and
a field electrode structure included in the trench and arranged separately and electrically insulated from the first electrode structure,
wherein the control electrode structure is disposed along sidewalls of the trench in an upper part of the trench,
wherein the field electrode structure is spaced inward from and below the control electrode structure in a lower part of the trench,
wherein the control electrode structure and the field electrode structure are electrically connected to different potentials.

* * * * *